United States Patent [19]

Klemarczyk et al.

[11] Patent Number: 4,666,953
[45] Date of Patent: May 19, 1987

[54] SILICONE POLYPHOTOINITIATORS

[75] Inventors: Philip Klemarczyk, Collinsville; Steven T. Nakos, Andover, both of Conn.; Samuel Q. S. Lin, Fort Lee, N.J.

[73] Assignee: Loctite Corporation, Newington, Conn.

[21] Appl. No.: 717,253

[22] Filed: Mar. 28, 1985

[51] Int. Cl.$^4$ .......... C08F 2/50; C08F 30/08; C08G 77/20; C08G 77/40
[52] U.S. Cl. .......... 522/34; 522/35; 522/36; 522/44; 522/99; 522/172; 522/904; 526/279; 528/32; 430/281
[58] Field of Search .......... 204/159.13; 522/35, 522/44, 34, 36

[56] References Cited

U.S. PATENT DOCUMENTS

| | | | |
|---|---|---|---|
| 4,273,907 | 6/1981 | Takamizawa | 528/29 |
| 4,284,485 | 8/1981 | Berner | 522/44 |
| 4,308,400 | 12/1981 | Felder | 522/44 |
| 4,391,963 | 7/1983 | Shirahata | 528/37 |
| 4,467,082 | 8/1984 | Shirahata | 528/43 |
| 4,477,326 | 10/1984 | Lin | 204/159.13 |
| 4,507,187 | 3/1985 | Jacobine | 522/35 |
| 4,534,838 | 8/1985 | Lin et al. | 522/35 |
| 4,536,265 | 8/1985 | Fabrizio | 522/35 |

OTHER PUBLICATIONS

Roffey "Photopolymerization of Surface Coatings" 1982, p. 79.

*Primary Examiner*—John C. Bleutge
*Assistant Examiner*—Arthur H. Koeckert
*Attorney, Agent, or Firm*—Vidas & Arrett

[57] ABSTRACT

Polyorganosiloxanes having an average of more than two siloxane repeat units, at least one of which repeat units includes a photoinitiating group bound to the silicon atom thereof, the photoinitiating group having the formula

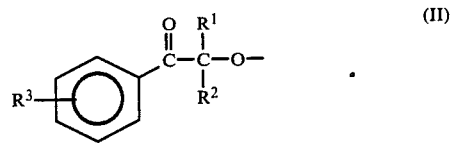

(II)

where $R^1$ and $R^2$ are the same or different alkyl groups or $R^1$ and $R^2$ are alkylene groups linked to each other so that $R^1$ and $R^2$ together with the carbon atom to which both are attached comprise a cycloalkyl group, and $R^3$ is H or hydrocarbyl.

Compositions of these polyorganosiloxanes and silicones or organic monomers with free radical curable groups are readily cured by irradiation with UV light.

6 Claims, No Drawings

SILICONE POLYPHOTOINITIATORS

FIELD OF THE INVENTION

This invention relates to polyorganosiloxanes having photoinitiator moieties bonded to the polymer backbone.

BACKGROUND OF THE INVENTION

In U.S. Pat. No. 4,273,907 and Japanese Kokai 54/50067 organopolysiloxane compounds are described which have at least one benzoin group represented by the general formula

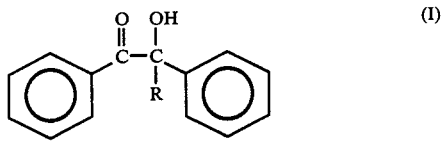 (I)

where R is H or alkyl, bonded to a silicon atom in the molecule. Exemplified are compounds where R is H or methyl. However, it is well known that Si—O—C bonds readily hydrolyze and, in U.S. Pat. No. 4,391,963, it is noted that these photoinitiators are very unstable to moisture.

Another approach to providing polymer bound silicone polyphotoinitiators has been to prepare photoinitiator moieties with ethylenic or acetylenic unsaturation and then to react the photoinitiator with an SiH containing condensable silane or SiH containing polyorganosiloxane in the presence of a hydrosilation catalyst to give Si—C bound photomoieities. Such approach is taken in U.S. Pat. Nos. 4,273,907, 4,477,326, and U.S. Pat. No. 4,467,082.

SUMMARY OF THE INVENTION

Applicants have surprisingly discovered that photoinitiators of the α-hydroxy-α,α-dialkyl-acetophenone type may be condensed with polyorganosiloxanes containing hydrolyzable groups to give storage stable silicone photoinitiators. The inventive compounds also are more effective photoinitiators than the structurally similar photoinitiators of formula I above where R is alkyl.

DETAILED DESCRIPTION OF THE INVENTION

The inventive compounds are polyorganosiloxanes having an average of more than two siloxane repeat units, at least one of which repeat units includes a photoinitiating group bound to the silicon atom thereof, the photoinitiating group having the formula

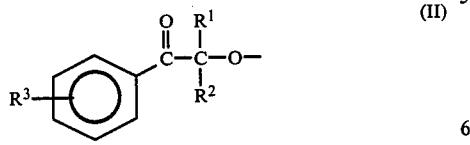 (II)

where $R^1$ and $R^2$ are the same or different alkyl groups or $R^1$ and $R^2$ are alkylene groups linked to each other so that $R^1$ and $R^2$ together with the carbon atom to which both are attached comprise a cycloalkyl group, and $R^3$ is H or hydrocarbyl, such as methyl or phenyl.

The polyphotoinitiators of the invention are prepared by condensation of a compound of the formula

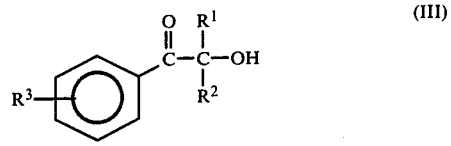 (III)

where $R^1$, $R^2$ and $R^3$ are as previously defined, with a polyorganosiloxane containing one or more, preferably a plurality, of hydrolyzable groups such as hydroxyl, dimethylamino, acetoxy, chloro or alkoxy. Suitable $R^1$ and $R^2$ groups include methyl and ethyl groups. $R^1$ and $R^2$ may also be linked alkylene groups, thereby forming a cycloalkyl moiety with the carbon atom to which both are attached.

The polyphotoinitiators of the invention are most suitable as photoinitiators for compositions of free radical curable silicones, that is polyorganosiloxanes which include free radical curable groups such as (meth)acrylate, vinyl, alkylthiol, maleate, itaconate, styryl, silicon hydride, etc. (Meth)acrylate and vinyl groups are preferred. Lower molecular weight polyphotoinitiators of the invention with multiple polymer bound photoinitiating groups are also suitable as photoinitiators for compositions of free radically curable organic monomers, such as isobornyl methacrylate.

Generally the organo groups on the hydrolyzable polyorganosiloxanes used to prepare the inventive polyphotoinitiators will be alkyl, haloalkyl, or aryl groups such as methyl, trifluoropropyl or propyl groups. However, the polyphotoinitiators of the invention will be self-curing if prepared from hydroxy functional silicones which also contain a plurality of free radical curable functional groups, as described above, bound to the polymer backbone.

The invention is illustrated by the following example.

EXAMPLE

A 250 ml three neck flask, equipped with a mechanical stirrer, condenser, thermometer and nitrogen blanket, was charged with an α,ω-bis(N,N-dimethylamino)-polydimethylsiloxane (MW about 36,000) (41.4 g, 1.15 mmole); 2.3 mmole of Irgacure ®184, a photoinitiator of the formula

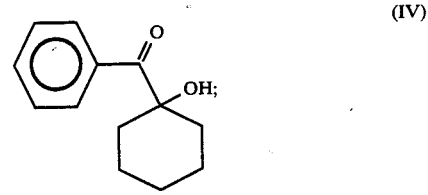 (IV)

and 50 ml chlorobenzene. The solution was heated to reflux overnight and solvent was removed under reduced pressure. The product was vacuum dried for three hours at 65° C. for three hours at 65° C. and 0.5 mmHg.

The polymer bound photoinitiator was then added at a 10% level to a 14,000 molecular weight α-ω-bis(acryloxypropenyl)-polydimethylsiloxane. A ¼" thick sample of the composition in a 50 ml beaker was exposed to 70 mW/cm² UV irradiation for 60 seconds. The beaker was then inverted and the bottom irradiated for an additional 20 seconds to give a uniformly cured cheezy polymer.

A sample of polymer bound photoinitiator prepared as in this example showed no signs of hydrolytic decomposition after being stored in a closed opaque container for 10 months.

COMPARATIVE EXAMPLE

α-Methylbenzoin

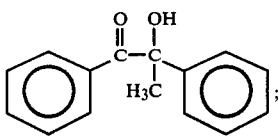

was prepared by the method of Tapio Hase, Synthesis, 1980 page 36, and purified by column chromatography. A polymer bound benzoin photoinitiator was prepared by the method of Example 1, substituting an equivalent amount of α-methyl benzoin for the Irgacure ®184. A 10% composition of this photoinitiator in the 14,000 MW acrylate terminated silicone used in Example 1 was then prepared and a ¼" thick sample in a 50 ml beaker irradiated with 70 mW/cm² for 2 minutes. The liquid composition did not even skin over.

We claim:

1. A photocurable composition comprising a free radical curable silicone and, as a photoinitiator, a polyorganosiloxane having an average of more than two siloxane repeat units, at least one of which repeat units includes a photoinitiating group bound to the silicon atom thereof, the photoinitiating group having the formula:

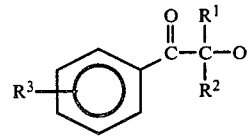

where $R^1$ and $R^2$ are the same or different alkyl groups or $R^1$ and $R^2$ are alkylene groups linked to each other so that $R^1$ and $R^2$ together with the carbon atom to which both are attached comprise a cycloalkyl group and $R^3$ is H or hydrocarbyl.

2. A composition as in claim 1 wherein $R^3$ is H, methyl or phenyl.

3. A composition as in claim 1 where $R^1$ and $R^2$ are selected from methyl and ethyl groups.

4. A composition as in claim 1 where $R^1$ and $R^2$ together with the carbon atom to which they are attached comprise a cyclohexyl group.

5. A composition as in claim 1 wherein the free radical curable silicone is a polyorganosiloxane which includes free radically curable groups selected from (meth)acrylate, vinyl, alkylthiol, maleate, itaconate, styryl, and silicon hydride groups.

6. A composition as in claim 1 wherein said photoinitiator polyorganosiloxane further includes a plurality of free radical curable groups, bound to the polymer backbone, said free radical curable groups selected from (meth)acrylate, vinyl, alkylthiol, maleate, itaconate, styryl and silicon hyride.

* * * * *